US012114461B2

(12) United States Patent
Xu et al.

(10) Patent No.: US 12,114,461 B2
(45) Date of Patent: Oct. 8, 2024

(54) POWER ADAPTER AND MANUFACTURING METHOD THEREOF

(71) Applicant: Huawei Digital Power Technologies Co., Ltd., Shenzhen (CN)

(72) Inventors: Chunxia Xu, Dongguan (CN); Jun Chen, Dongguan (CN); Xiaowei Hui, Dongguan (CN); Hao Wu, Xi'an (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 245 days.

(21) Appl. No.: 17/711,843

(22) Filed: Apr. 1, 2022

(65) Prior Publication Data
US 2022/0338371 A1 Oct. 20, 2022

(30) Foreign Application Priority Data

Apr. 16, 2021 (CN) .......................... 202110409563.6

(51) Int. Cl.
*H05K 7/20* (2006.01)
*H01R 13/66* (2006.01)
*H01R 24/68* (2011.01)

(52) U.S. Cl.
CPC ....... *H05K 7/20145* (2013.01); *H01R 13/665* (2013.01); *H01R 24/68* (2013.01); *H05K 7/20909* (2013.01)

(58) Field of Classification Search
CPC ............... H05K 7/20909; H05K 7/209; H05K 7/20918; H05K 7/20136; H05K 5/0213; H05K 5/064; H05K 7/1427; H05K 7/20427; H01R 31/065; H01R 24/68; H01R 13/665; H01R 31/06

USPC .......... 361/695, 690, 692, 694, 714, 679.46, 361/704, 719, 601, 636, 705, 703, 752, 361/730; 165/104.33, 80.2, 80.3; 363/141, 146, 142; 174/383, 387, 50,
(Continued)

(56) References Cited

U.S. PATENT DOCUMENTS 6,081,425 A * 6/2000 Cheng ..................... G06F 1/203
                                                              165/122
7,289,320 B2 * 10/2007 Chang ................ H05K 7/20145
                                                              165/122
(Continued)

FOREIGN PATENT DOCUMENTS

CN         205248826 U       5/2016
CN         206039424 U       3/2017
(Continued)

*Primary Examiner* — Mandeep S Buttar
(74) *Attorney, Agent, or Firm* — Leydig, Voit & Mayer, Ltd.

(57) ABSTRACT

A power adapter and a manufacturing method thereof are provided. The power adapter includes a housing, a circuit board assembly, and a first heat dissipation part. There is accommodation space inside the housing, a line interface is disposed at a first end of the housing, and a power connector is disposed at a second end of the housing. The circuit board assembly is disposed in the accommodation space, and the circuit board assembly is electrically connected to the line interface and the power connector. The first heat dissipation part coats the outside of the circuit board assembly, and there is a gap between an outer wall of the first heat dissipation part and an inner wall of the housing.

12 Claims, 14 Drawing Sheets

(58) Field of Classification Search
USPC ............... 174/547, 16.1, 17 R, 17 VA, 521; 439/628
See application file for complete search history.

(56) References Cited

U.S. PATENT DOCUMENTS

| | | | | |
|---|---|---|---|---|
| 7,843,684 | B2* | 11/2010 | Lu | H05K 5/06 165/104.34 |
| 10,477,724 | B2* | 11/2019 | Brianese | H05K 7/20154 |
| 2010/0202111 | A1* | 8/2010 | Liang | H05K 5/064 361/720 |
| 2014/0268564 | A1* | 9/2014 | Sagneri | H05K 7/20918 361/692 |
| 2016/0352119 | A1 | 12/2016 | Noh et al. | |
| 2021/0081011 | A1 | 3/2021 | Sagneri et al. | |

FOREIGN PATENT DOCUMENTS

| | | |
|---|---|---|
| CN | 106877629 A | 6/2017 |
| CN | 106998087 A | 8/2017 |
| CN | 206525072 U | 9/2017 |
| CN | 108366484 A | 8/2018 |
| CN | 207868988 U | 9/2018 |
| CN | 109219318 A | 1/2019 |
| CN | 109347304 A | 2/2019 |
| CN | 208489664 U | 2/2019 |
| CN | 208571898 U | 3/2019 |
| CN | 208674929 U | 3/2019 |
| CN | 109661152 A | 4/2019 |
| CN | 208904684 U | 5/2019 |
| CN | 208924093 U | 5/2019 |
| CN | 209217939 U | 8/2019 |
| CN | 209420193 U | 9/2019 |
| CN | 107484391 B | 2/2020 |
| CN | 210721355 U | 6/2020 |
| CN | 112399787 A | 2/2021 |
| CN | 212543663 U | 2/2021 |
| CN | 112437572 A | 3/2021 |
| CN | 212677059 U | 3/2021 |
| CN | 113242670 A | 8/2021 |
| CN | 215300226 U | 12/2021 |
| EP | 4050980 A2 | 8/2022 |
| JP | 2007156071 A | 6/2007 |
| WO | 2015090103 A1 | 6/2015 |
| WO | 2017120768 A1 | 7/2017 |

* cited by examiner

POWER ADAPTER AND MANUFACTURING METHOD THEREOF

CROSS-REFERENCE TO RELATED APPLICATION

This application claims priority to Chinese Patent Application No. 202110409563.6, filed on Apr. 16, 2021, which is hereby incorporated by reference in its entirety.

TECHNICAL FIELD

Embodiments of this application relate to the field of electronic device technologies, and in particular, to a power adapter and a manufacturing method thereof.

BACKGROUND

As an auxiliary apparatus for supply voltage conversion, a power adapter serves a smartphone and a notebook computer and is widely applied in people's life and work. When the power adapter works, an internal electronic component of the power adapter generates a relatively large amount of heat. Heat dissipation processing needs to be performed in time, to dissipate the heat to the outside, to prevent the internal component from being damaged due to overheating. Natural heat dissipation is used for a current power adapter. Thermally conductive potting glue is filled in a part of the inside of the adapter, glue is dispensed on a part of an internal component of the adapter, or a heat dissipation member such as a thermally conductive pad or a copper sheet is added to an internal component of the adapter, to guide heat of the component to a housing of the adapter by using the glue or the heat dissipation member, and then perform natural heat dissipation by using the housing. However, in a development trend of the adapter towards miniaturization and high power, the internal component of the adapter is relatively close to the housing, and therefore the heat of the component is very likely to be transferred to the housing by using the glue or the heat dissipation member, causing an excessively high temperature of the housing.

SUMMARY

This application provides a power adapter and a manufacturing method thereof, to reduce a temperature of a housing of the power adapter.

According to a first aspect, this application provides a power adapter, including a housing, a circuit board assembly, and a first heat dissipation part. There is accommodation space inside the housing, a line interface is disposed at a first end of the housing, and a power connector is disposed at a second end of the housing. The circuit board assembly is disposed in the accommodation space, and the circuit board assembly is electrically connected to the line interface and the power connector. The first heat dissipation part coats the outside of the circuit board assembly, and there is a gap between an outer wall of the first heat dissipation part and an inner wall of the housing.

According to the technical solutions provided in this application, the outside of the circuit board assembly is coated with the first heat dissipation part, and there is the gap between the outer wall of the first heat dissipation part and the inner wall of the housing, so that an air layer is formed between the first heat dissipation part and the housing, to increase thermal resistance between the circuit board assembly and the housing, implement heat insulation between the circuit board assembly and the housing, and reduce a speed at which a heat emitting component of the circuit board assembly transfers heat to the housing. Therefore, internal heat of the power adapter can be relatively slowly dissipated from the housing, to prevent the housing from overheating in short time, thereby reducing a temperature of the housing of the power adapter, and improving overall reliability and safety of the power adapter, so that an overall service life of the power adapter can also be prolonged.

In a specific implementable solution, a second heat dissipation part is disposed on the outer wall of the first heat dissipation part, and an end that is of the second heat dissipation part and that faces away from the first heat dissipation part is close to the inner wall of the housing or abuts against the inner wall of the housing. Heat generated when electronic components that each generate a relatively small amount of heat in the circuit board assembly work is not enough to enable the housing to reach a relatively high temperature. Therefore, the second heat dissipation part is disposed, to relatively quickly transfer the heat generated when these electronic components work to the housing, thereby improving overall heat dissipation efficiency of the power adapter.

In a specific implementable solution, a first heating vent and a second heating vent that connect the inside and the outside of the housing are disposed in the housing, the first heating vent is located at the first end of the housing, and the second heating vent is located between the first end of the housing and the second end of the housing. Alternatively, the first heating vent is located between the first end of the housing and the second end of the housing, and the second heating vent is also located between the first end of the housing and the second end of the housing. The first heating vent and the second heating vent are disposed, so that air can circulate between the inside and the outside of the housing, to accelerate dissipation of internal heat of the power adapter.

In a specific implementable solution, the power adapter further includes a heat dissipation assembly, where the heat dissipation assembly is disposed in the gap between the outer wall of the first heat dissipation part and the inner wall of the housing, and the heat dissipation assembly is connected to the outer wall of the first heat dissipation part or the inner wall of the housing. The heat dissipation assembly is disposed, so that overall heat dissipation efficiency of the power adapter can be improved.

In a specific implementable solution, the heat dissipation assembly includes a heat dissipation fan, and a power supply line of the heat dissipation fan is electrically connected to the circuit board assembly. The heat dissipation fan can accelerate air flowing between the inside and the outside of the housing, to accelerate dissipation of internal heat of the housing to the outside.

When the heat dissipation fan is specifically disposed, there are a plurality of heat dissipation fans, one part of the heat dissipation fans are disposed near the first heating vent, and the other part of the heat dissipation fans are disposed near the second heating vent. The heating vents connect the inside and the outside of the housing, and the heat dissipation fans are disposed near the heating vents, so that air flowing between the inside and the outside of the housing can be further accelerated.

In a specific implementable solution, a heat dissipation groove is disposed on the inner wall of the housing, and the heat dissipation groove extends from the first heating vent to the second heating vent. The heat dissipation groove can effectively guide a flow path of internal air of the housing, so that targeted heat dissipation can be implemented. For example, air is guided, by using the heat dissipation groove, to flow through electronic components that each generate a relatively large amount of heat, to help dissipate heat for the electronic components that each generate a relatively large amount of heat, thereby improving overall heat dissipation efficiency of the power adapter.

In a specific implementable solution, the housing includes at least a first part and a second part that are sequentially connected, the line interface is disposed on the first part, and the power connector is disposed on the second part. The housing uses a split design, so that housing machining is more flexible, to facilitate adaption to different machining conditions.

When the first part and the second part are specifically disposed, the first part is of a hollow columnar structure, one end of the first part is a closed end, and the other end of the first part is an open end; the second part is of a plate-shape structure; and the second part is connected to the open end of the first part. Alternatively, the first part is of a hollow columnar structure, one end of the first part is a closed end, and the other end of the first part is an open end; the second part is also of a hollow columnar structure, one end of the second part is a closed end, and the other end of the second part is an open end; and the open end of the first part is connected to the open end of the second part. The first part of the hollow columnar structure is conveniently formed, and the second part of the plate-shape structure or the hollow columnar structure is also conveniently formed, so that housing machining is convenient.

In a specific implementable solution, the first heat dissipation part is formed by using a glue potting process. Glue used in the glue potting process may be glue having a heat-conducting property, or may be glue having both a heat storage property and a heat-conducting property. The first heat dissipation part is conveniently formed, and when the glue used for glue potting for the first heat dissipation part is glue having both a heat storage property and a heat-conducting property, the first heat dissipation part can temporarily store heat generated by the electronic heat emitting component, and then relatively slowly dissipate the heat. The heat is dissipated to the outside by using the housing, so that the housing can be further prevented from overheating in short time.

According to a second aspect, this application provides a power adapter manufacturing method, including:
  forming a first heat dissipation part outside a circuit board assembly by using a glue potting process, where the first heat dissipation part fastens a line interface and a power connector to the circuit board assembly; and
  disposing the circuit board assembly coated with the first heat dissipation part inside a housing together with the line interface and the power connector, where a free end of the power connector penetrates out of the housing, and there is a gap between an outer wall of the first heat dissipation part and an inner wall of the housing.

According to the technical solutions provided in this application, after the first heat dissipation part is formed outside the circuit board assembly by using the glue potting process, the circuit board assembly is installed inside the housing. Compared with existing in-housing potting, a limitation of a potting condition is broken through, so that a potting condition can be wider, and housing machining limitations can also be reduced. Therefore, the power adapter is more conveniently manufactured as a whole, and a temperature of the housing can be effectively reduced when the manufactured power adapter works.

In a specific implementable solution, a minimum width of the gap between the outer wall of the first heat dissipation part and the inner wall of the housing is a; and the method further includes: forming a second heat dissipation part on the outer wall of the first heat dissipation part, where the second heat dissipation part protrudes from the outer wall of the first heat dissipation part, and a height at which the second heat dissipation part protrudes from the outer wall of the first heat dissipation part is less than or equal to a. After the circuit board assembly on which the first heat dissipation part and the second heat dissipation part are formed is disposed inside the housing, an end that is of the second heat dissipation part and that is away from the first heat dissipation part is close to the inside wall of the housing or abuts against the inside wall of the housing. This can help an electronic component that generates a relatively small amount of heat relatively quickly transfer heat generated during working to the housing, thereby improving overall heat dissipation efficiency of the power adapter.

When the second heat dissipation part is specifically formed, the second heat dissipation part is integrally formed with the first heat dissipation part, so that the second heat dissipation part is conveniently and quickly formed, thereby helping improve production efficiency.

REFERENCE NUMERALS

100—housing; 200—line interface; 300—power connector; 400—printed circuit board; 500—electronic component; 600—first heat dissipation part; 700—second heat dissipation part; 800—heat dissipation fan; 101—first heating vent; 102—second heating vent; 103—heat dissipation groove; 104—first part; 105—second part; 106—first protrusion; and 107—second protrusion.

DESCRIPTION OF EMBODIMENTS

The following describes in detail embodiments of this application with reference to accompanying drawings.

For ease of understanding, an application scenario of a power adapter in embodiments of this application is first described. The power adapter provided in embodiments of this application is configured to: connect a power supply and an electronic device, and convert alternating current input from the power supply into direct current output, to assist in implementing electronic device charging. When the power adapter works, an internal electronic component generates heat. For an existing power adapter, usually, thermally conductive potting glue is filled inside the power adapter to coat an internal heat emitting component of the adapter, or glue is dispensed on an internal heat emitting component of the adapter, or a heat dissipation member such as a thermally conductive pad or a copper sheet is added to an internal heat emitting component of the adapter, to guide heat generated by the heat emitting component to a housing of the adapter, to implement heat dissipation. However, in a development trend of the adapter towards miniaturization and high power, the internal electronic component of the adapter is relatively close to the housing of the adapter. The foregoing heat dissipation manner shows a disadvantage, that is, the heat of the heat emitting component is very likely to be transferred to the housing, causing the housing to quickly rise to a relatively high temperature. This has relatively great impact on use safety and a service life of the adapter.

Based on this, embodiments of this application provide a power adapter, to implement thermal resistance control of the power adapter and reduce a temperature of a housing of the power adapter.

Figure 1:
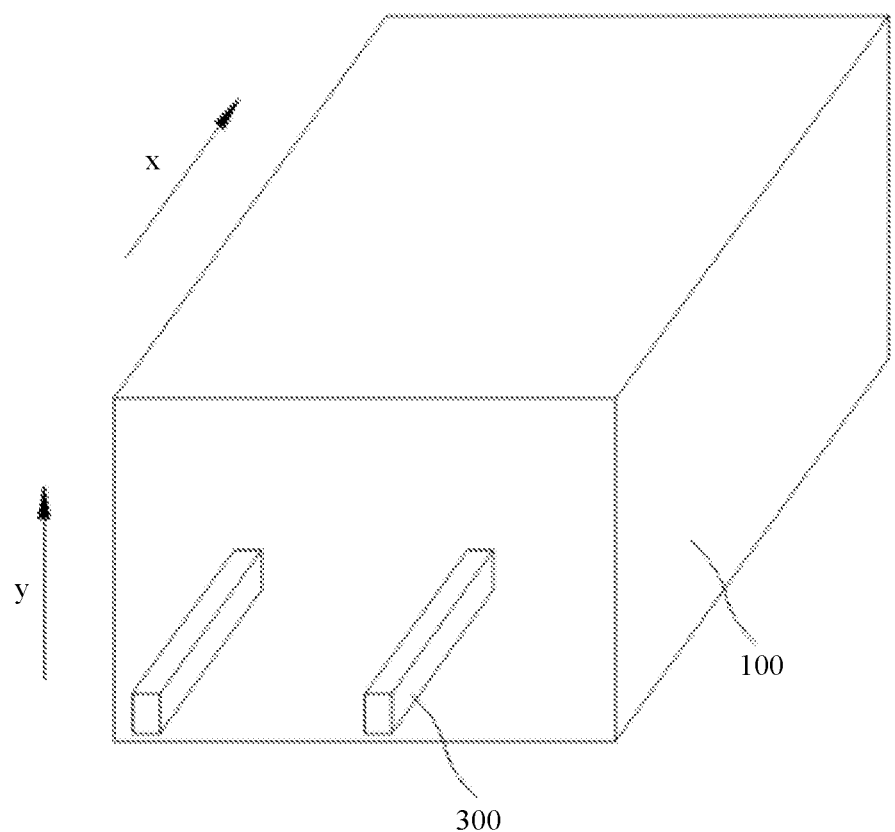
FIG. 1 is a schematic diagram of a three-dimensional structure of a power adapter according to an embodiment of this application.
Figure 2:
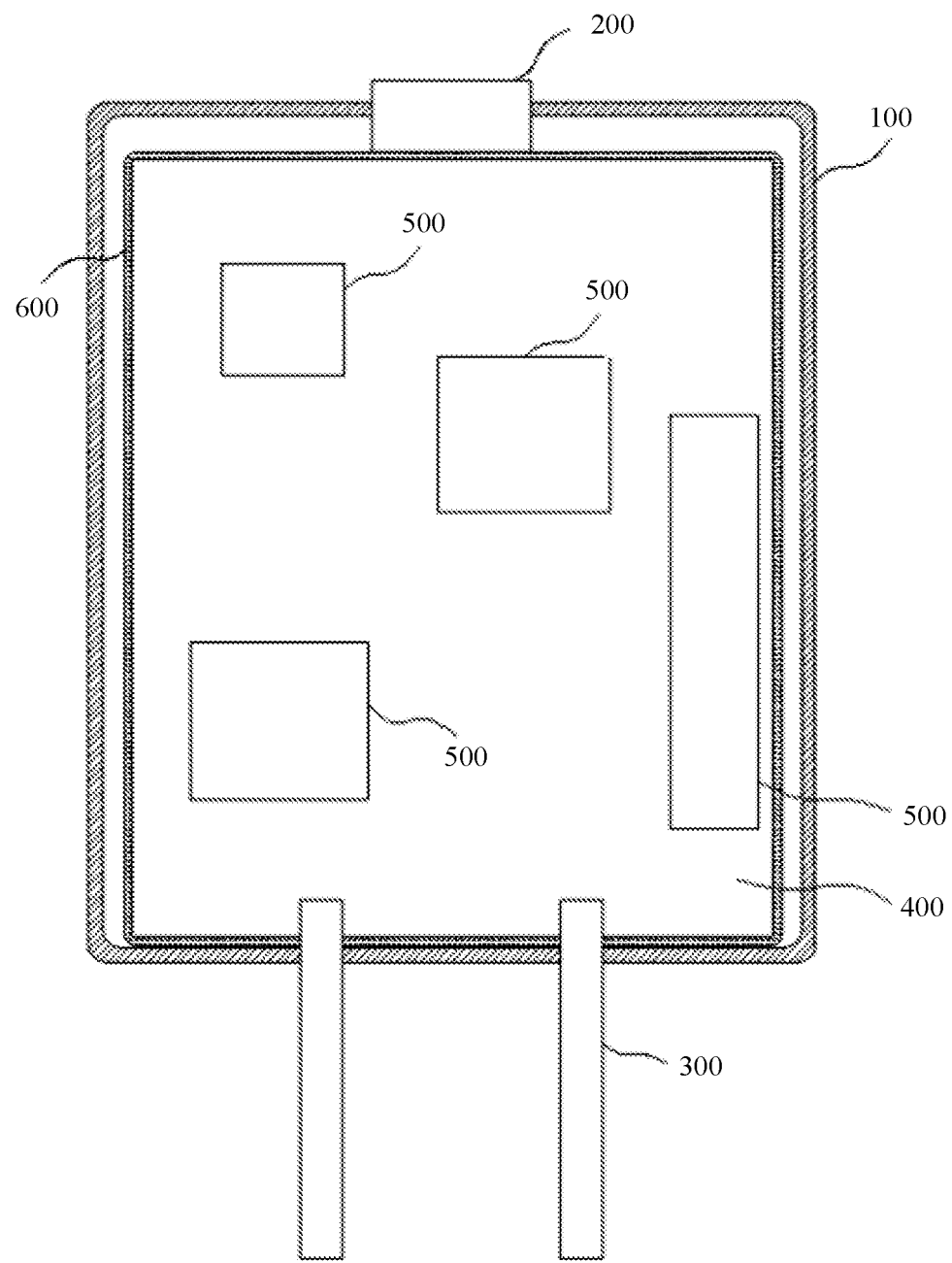
FIG. 2 is a schematic diagram of a cross-sectional structure of the power adapter shown in FIG. 1 in an x direction.
Figure 3:
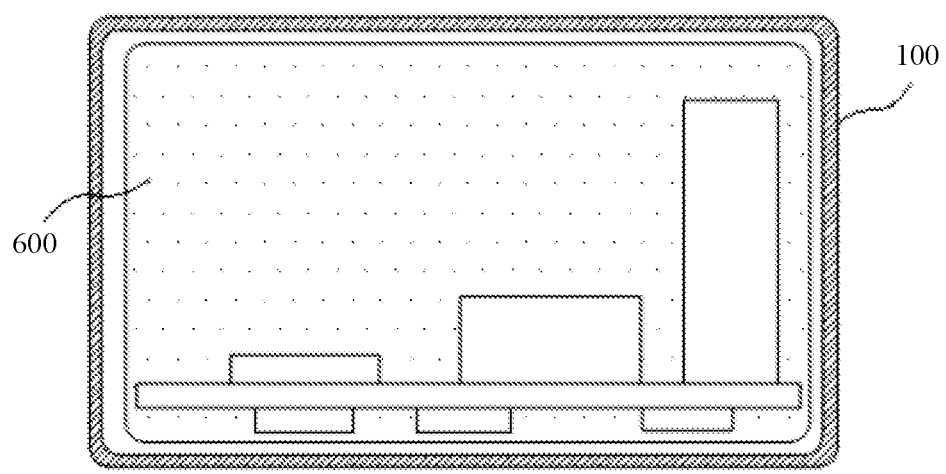
FIG. 3 is a schematic diagram of a cross-sectional structure of the power adapter shown in FIG. 1 in a y direction.
Figure 4:
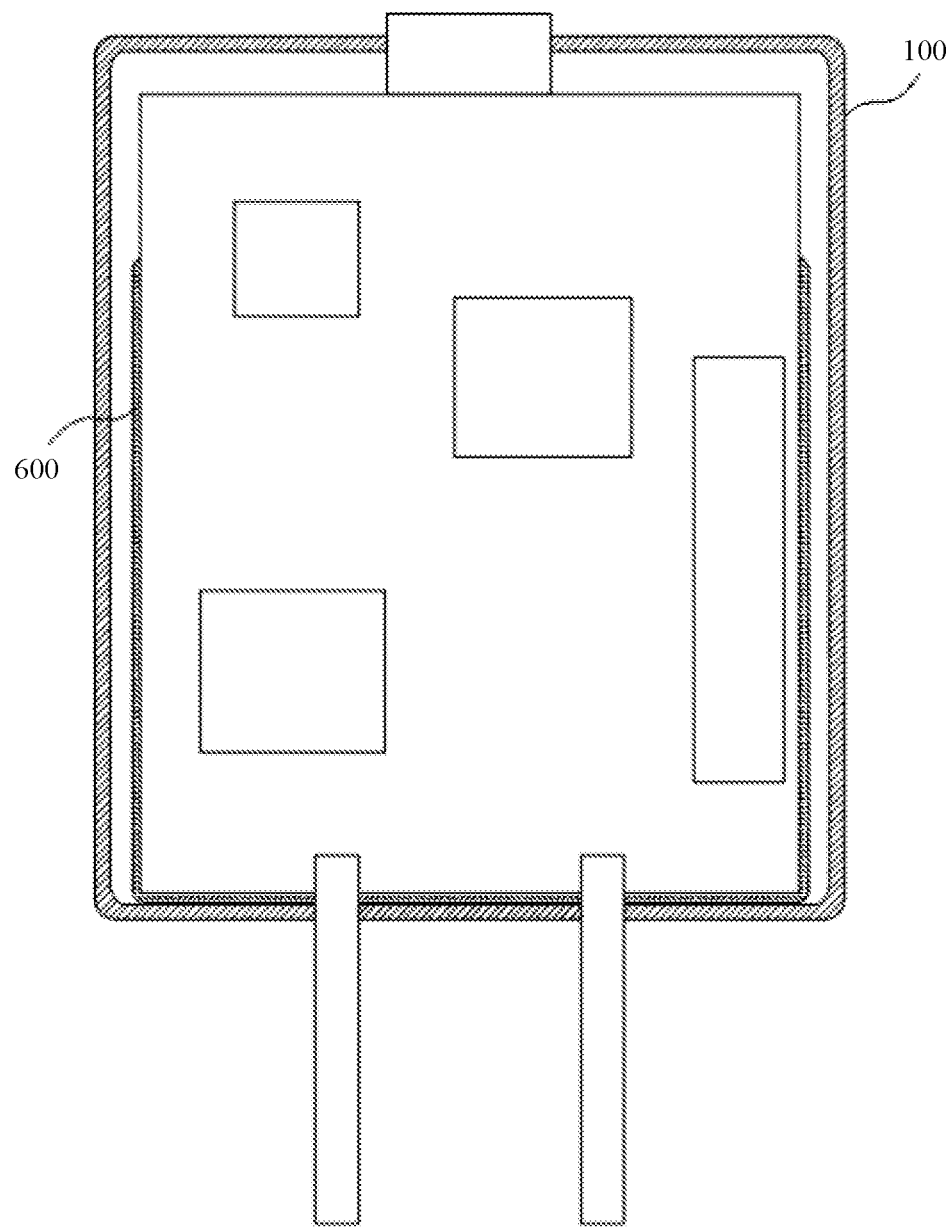
FIG. 4 is a schematic diagram of another cross-sectional structure of the power adapter shown in FIG. 1 in an x direction.

FIG. 1 is a schematic diagram of a three-dimensional structure of a power adapter according to an embodiment of this application. FIG. 2 is a schematic diagram of a cross-sectional structure of the power adapter shown in FIG. 1 in an x direction. FIG. 3 is a schematic diagram of a cross-sectional structure of the power adapter shown in FIG. 1 in a y direction. FIG. 4 is a schematic diagram of another cross-sectional structure of the power adapter shown in FIG. 1 in an x direction. Refer to FIG. 1 and FIG. 2 together. The power adapter provided in this embodiment of this application includes a housing 100, a circuit board assembly, and a first heat dissipation part 600. The housing 100 is of a closed structure, and there is accommodation space inside the housing 100. A line interface 200 is disposed on a first end of the housing 100, and the line interface 200 may be a USB interface. A power connector 300 is disposed on a second end of the housing 100, and the power connector 300 penetrates through a side wall of the second end of the housing 100, that is, one end of the power connector 300 is located inside the housing 100, and the other end of the power connector 300 is located outside the housing 100. The power connector 300 may be configured to be connected to a power supply, for example, connected to a 220 V standard voltage power supply most commonly used by industrial and mining enterprises and residents. It may be understood that an opening is disposed at a position that is of the housing 100 and that corresponds to the line interface 200, to install the line interface 200, and an opening is also disposed at a position that is of the housing 100 and that corresponds to the power connector 300, to install the power connector 300.

The circuit board assembly is a main body that implements a power adaptation function. The circuit board assembly includes a circuit board 400 and a plurality of types of electronic components 500 disposed on the circuit board 400, such as a transformer, an inductor, and a capacitor. The circuit board 400 may be specifically a printed circuit board (PCB). The circuit board assembly is disposed in the accommodation space inside the housing 100, and the circuit board assembly is separately electrically connected to the line interface 200 and the power connector 300. The circuit board assembly may be connected to the end that is of the power connector 300 and that is located inside the housing 100, to implement relative fastening of the circuit board assembly inside the housing 100.

Refer to FIG. 2 and FIG. 3 together. The first heat dissipation part 600 coats the outside of the circuit board assembly, and there is a gap between an outer wall of the first heat dissipation part 600 and an inner wall of the housing 100, so that an air layer is formed between the first heat dissipation part 600 and the housing 100, to increase thermal resistance between the circuit board assembly and the housing 100, implement heat insulation between the circuit board assembly and the housing 100, and reduce a speed at which the heat emitting component of the circuit board assembly transfers heat to the housing 100. Therefore, internal heat of the adapter is relatively slowly dissipated from the housing 100, to prevent the housing 100 from overheating in short time, thereby reducing a temperature of the housing of the adapter, improving overall reliability and safety of the power adapter, and prolonging an overall service life of the power adapter.

In a specific implementation, as shown in FIG. 2, the first heat dissipation part 600 may coat the entire circuit board assembly. Alternatively, as shown in FIG. 4, the first heat dissipation part 600 may cover a part of the circuit board assembly, for example, mainly cover an electronic component that generates a relatively large amount of heat in the circuit board assembly and a region in which the electronic component is located. The first heat dissipation part 600 may be formed by using a glue potting process. Glue is filled in a gap between the circuit board and the electronic component, and is filled in a gap between adjacent electronic components, to coat the circuit board and the electronic component. The glue used for glue potting for the first heat dissipation part 600 may be glue having both a heat storage property and a heat-conducting property, such as phase-change heat storage glue. This glue can temporarily store heat generated by the heat emitting component, and then relatively slowly dissipate the heat. The heat is dissipated to the outside by using the housing 100, to prevent the housing 100 from overheating in short time. In particular, when rated power of the heat emitting component in the circuit board assembly is relatively high, cases in which the heat emitting component works in a safe power range but a temperature of the housing is already relatively high can be reduced. Alternatively, the glue used for glue potting for the first heat dissipation part 600 may be glue having only a heat-conducting property. Because there is the air layer between the first heat dissipation part 600 and the housing 100, a speed at which internal heat of the housing 100 is transferred to the housing 100 is reduced, so that the housing 100 does not overheat in short time, and a temperature of the housing 100 can also be reduced.

Figure 5:
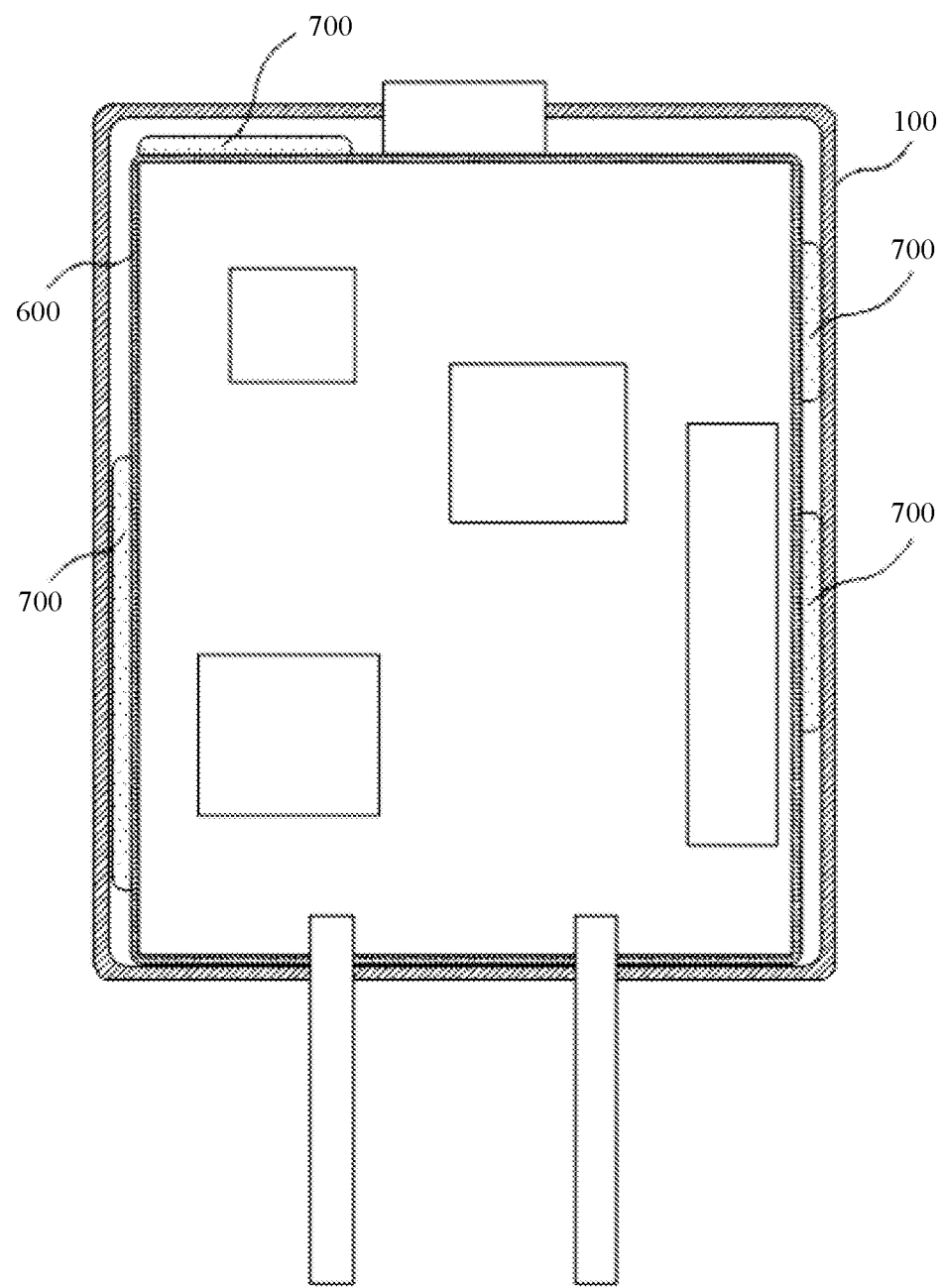
FIG. 5 is a schematic diagram of another cross-sectional structure of the power adapter shown in FIG. 1 in an x direction.
Figure 6:
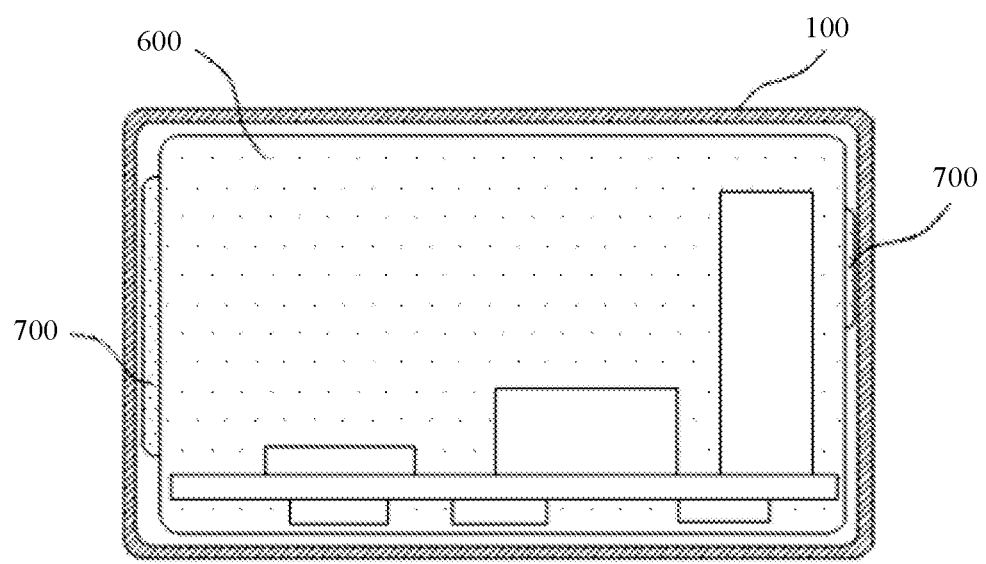
FIG. 6 is a schematic diagram of another cross-sectional structure of the power adapter shown in FIG. 1 in a y direction.

FIG. 5 is a schematic diagram of another cross-sectional structure of the power adapter shown in FIG. 1 in an x direction. FIG. 6 is a schematic diagram of another cross-sectional structure of the power adapter shown in FIG. 1 in a y direction. As shown in FIG. 5 and FIG. 6, in some embodiments, a second heat dissipation part 700 may be disposed on the outer wall of the first heat dissipation part 600, and a disposition position of the second heat dissipation part 700 may correspond to a position of an electronic component that generates a relatively small amount of heat in the circuit board assembly, to relatively quickly transfer heat generated when the electronic component that generates a relatively small amount of heat works to the housing 100, and then dissipate the heat to the outside by using the housing 100. An end that is of the second heat dissipation part 700 and that is away from the first heat dissipation part 600 may be disposed near the inner wall of the housing 100, or may be disposed in contact with the inner wall of the housing 100, to relatively quickly transfer heat. Because the electronic component that generates a relatively small amount of heat does not enable the housing 100 to reach a relatively high temperature, the second heat dissipation part 700 is disposed, to relatively quickly transfer heat of the electronic component that generates a relatively small amount of heat to the housing 100, so that overall heat dissipation efficiency of the power adapter can be improved. During specific implementation, at the position of the electronic component that generates a relatively small amount of heat in the circuit board assembly, the second heat dissipation part 700 may be formed at a point of the position, and in this case, the second heat dissipation part 700 may be presented in a block shape; or the second heat dissipation part 700 may be formed along a line at the position, and in this case, the second heat dissipation part 700 may be presented in a strip shape, or may be presented in some other shapes consistent with a shape of the electronic component.

In a specific implementation, the second heat dissipation part 700 may be formed by using a glue potting process. Glue used in the glue potting process may be glue having a heat-conducting property, or may be glue having both a heat storage property and a heat-conducting property. The first heat dissipation part 600 and the second heat dissipation part 700 may be first formed on the circuit board assembly. Specifically, the circuit board assembly may be placed in a potting mold, to integrally form the first heat dissipation part 600 and the second heat dissipation part 700 through glue potting. The potting mold may be a splicable mold, so that a demolding process performed after the first heat dissipation part 600 and the second heat dissipation part 700 are formed can be simplified. After demolding is completed, the circuit board assembly coated with the first heat dissipation part 600 and the second heat dissipation part 700 may be placed in the housing 100. In this out-of-housing potting manner, a limitation of a machining condition of existing in-housing potting can be broken through, so that a potting condition is wider. In addition, the inner wall of the housing can be a smooth structure. It may be understood that a protrusion or a depression that originally needs to be machined on the inner wall of the housing 100 may be migrated to a potting structure of the circuit board assembly for machining, so that machining of the housing 100 is simplified, thereby improving production efficiency of the power adapter as a whole.

Figure 7:
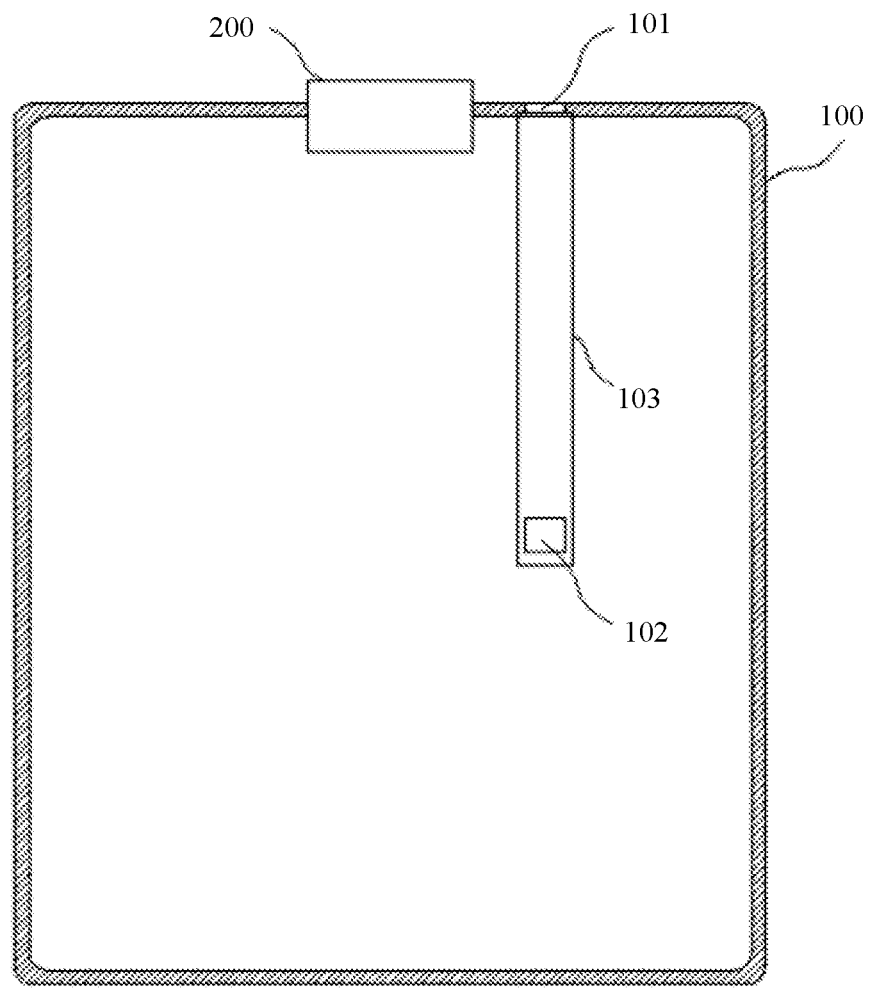
FIG. 7 is a schematic diagram of still another cross-sectional structure of the power adapter shown in FIG. 1 in an x direction.
Figure 8:
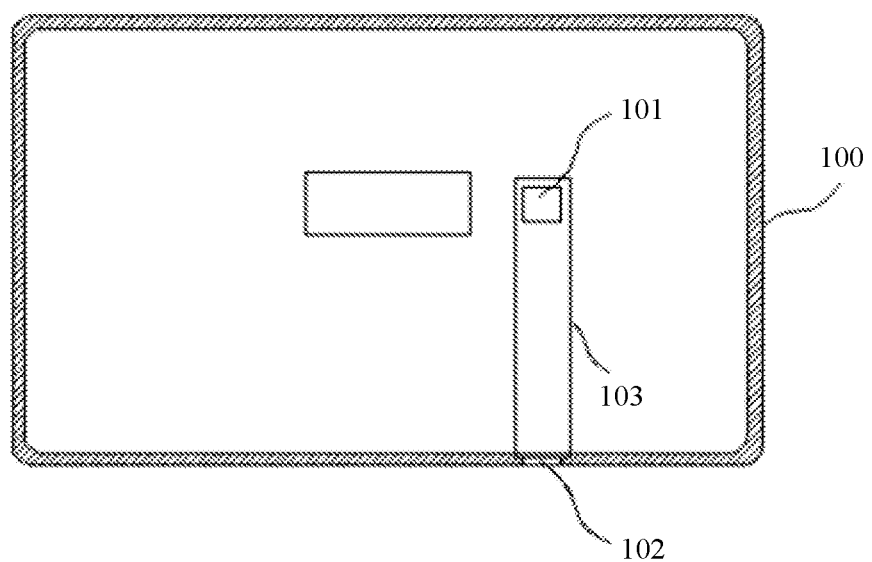
FIG. 8 is a schematic diagram of still another cross-sectional structure of the power adapter shown in FIG. 1 in a y direction.

FIG. 7 is a schematic diagram of still another cross-sectional structure of the power adapter shown in FIG. 1 in an x direction. FIG. 8 is a schematic diagram of still another cross-sectional structure of the power adapter shown in FIG. 1 in a y direction. Refer to FIG. 7 and FIG. 8 together. In some embodiments, a first heating vent 101 and a second heating vent 102 that connect the inside and the outside of the housing 100 may be disposed in the housing 100. The first heating vent 101 may be used as an air intake vent, and the second heating vent 102 may be used as an air exhaust vent, so that air can circulate between the inside and the outside of the housing 100, to improve heat dissipation efficiency of the power adapter.

The first heating vent 101 may be located at the first end of the housing 100, that is, located at an end that is of the housing 100 and that is at which the line interface 200 is disposed, for example, may be disposed near the line interface 200, or may share one opening with the line interface 200, so that a quantity of openings in the housing 100 can be reduced, to help improve appearance quality of the power adapter. Certainly, the first heating vent 101 may be alternatively located between the first end and the second end of the housing 100, for example, may be disposed in a region corresponding to alternating current (AC) input of the circuit board assembly. The second heating vent 102 may be located between the first end and the second end of the housing 100, for example, may be disposed in a region corresponding to AC input of the circuit board assembly. It should be noted that when the first heating vent 101 is also disposed in the region corresponding to the AC input of the circuit board assembly, the second heating vent 102 and the first heating vent 101 may be respectively located on upper and lower sides of the circuit board assembly.

In a specific implementation, there may be a plurality of first heating vents 101, to appropriately increase an air intake amount, and there may also be a plurality of second heating vents 102, to appropriately increase an air exhaust amount. In addition, to prevent an impurity from entering the housing 100, openings of the first heating vent 101 and the second heating vent 102 may be appropriately made small. In actual application, opening sizes of the first heating vent 101 and the second heating vent 102 may be comprehensively determined with reference to related conditions such as a ventilation quantity, impurity prevention, and machining difficulty.

In some embodiments, a heat dissipation groove 103 is disposed on the inner wall of the housing 100, and the heat dissipation groove 103 extends from the first heating vent 101 to the second heating vent 102. A start point and an end point of the heat dissipation groove 103 may respectively correspond to the first heating vent 101 and the second heating vent 102, and the heat dissipation groove 103 has a function of guiding air circulation. An extension path of the heat dissipation groove 103 may be flexibly disposed based on a heat emitting status of the electronic component in the circuit board assembly, so that air flows through as many electronic components that each generate a relatively large amount of heat as possible. This can help, as much as possible, dissipate heat for the electronic components that each generate a relatively large amount of heat, and take overall heat dissipation of the power adapter into consideration. In addition, disposition of the heat dissipation groove 103 further increases a heat-conducting area of the inner wall of the housing 100, so that heat dissipation efficiency of internal heat of the housing 100 can be improved.

Figure 9:
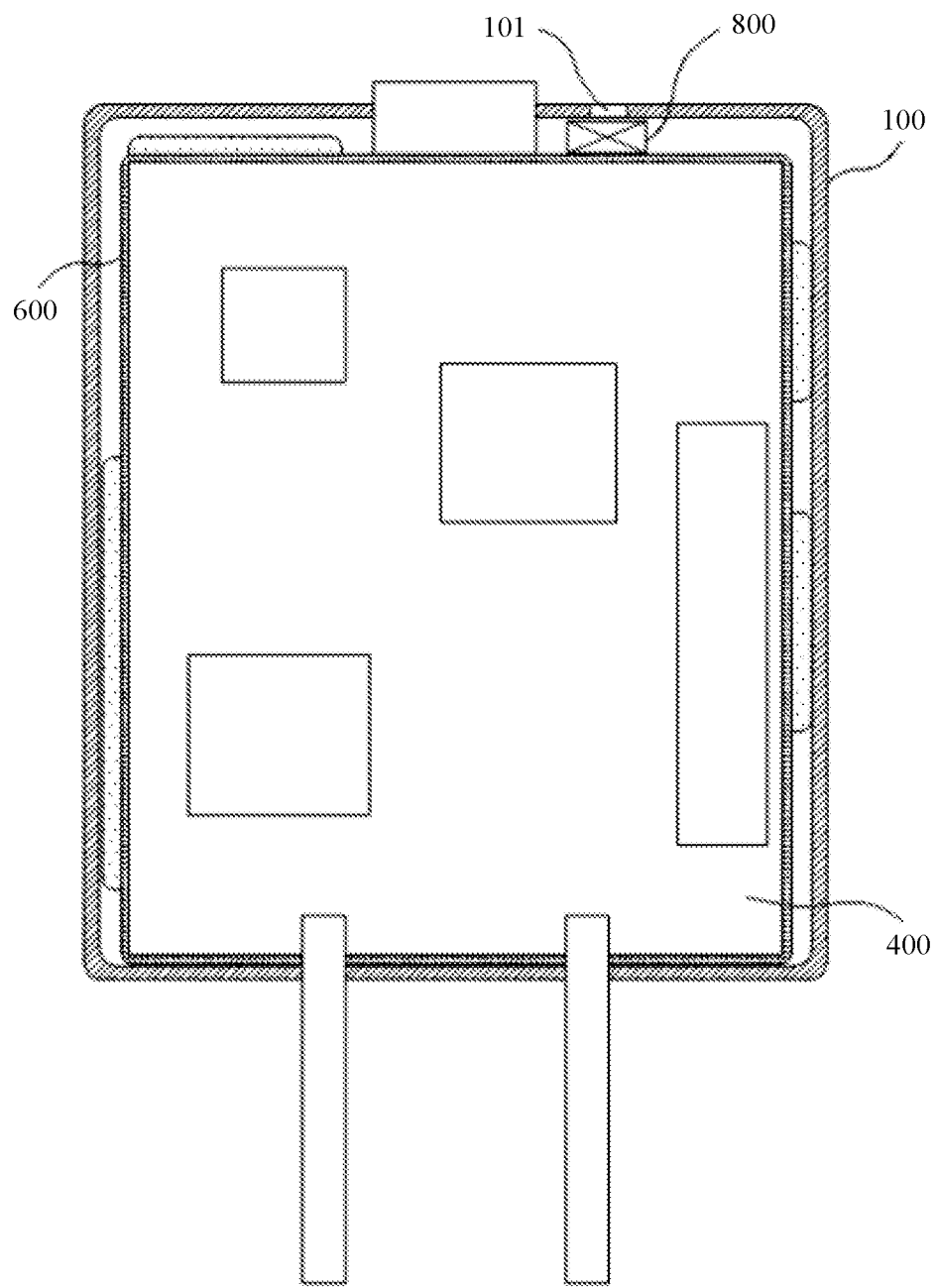
FIG. 9 is a schematic diagram of still another cross-sectional structure of the power adapter shown in FIG. 1 in an x direction.
Figure 10:
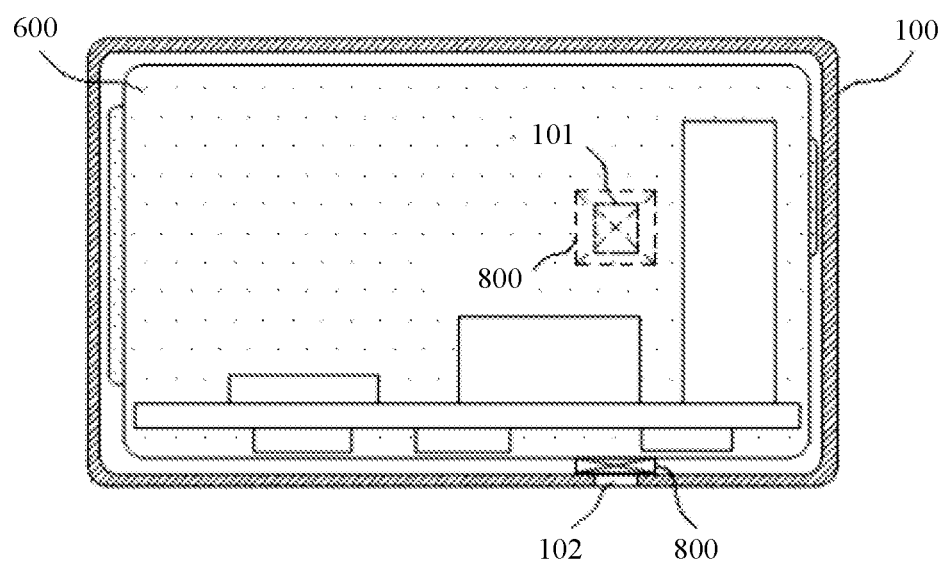
FIG. 10 is a schematic diagram of still another cross-sectional structure of the power adapter shown in FIG. 1 in a y direction.

FIG. 9 is a schematic diagram of still another cross-sectional structure of the power adapter shown in FIG. 1 in an x direction. FIG. 10 is a schematic diagram of still another cross-sectional structure of the power adapter shown in FIG. 1 in a y direction. Refer to FIG. 9 and FIG. 10 together. In some embodiments, the power adapter may further include a heat dissipation assembly. The heat dissipation assembly may be disposed in the gap between the outer wall of the first heat dissipation part 600 and the inner wall of the housing 100. During specific implementation, the heat dissipation assembly may be connected to the outer wall of the first heat dissipation part 600, or may be connected to the inner wall of the housing 100. The heat dissipation assembly may include a heat dissipation fan 800 and a structural member necessary for connecting the heat dissipation fan 800 to the outer wall of the first heat dissipation part 600 or the inner wall of the housing 100. The heat dissipation fan 800 may be electrically connected to a power supply line disposed on the circuit board 400, to supply power to the heat dissipation fan 800 by using the circuit board 400.

In a specific implementation, there may be a plurality of heat dissipation fans 800, one part of the heat dissipation fans 800 may be disposed in the first heating vent 101 or disposed near the first heating vent 101, and the other part of the heat dissipation fans 800 may be disposed in the second heating vent 102 or disposed near the second heating vent 102. Based on the foregoing description, the first heating vent 101 is used as an air intake vent, and the second heating vent 102 is used as an air exhaust vent. This may be specifically implemented by setting rotation directions of the heat dissipation fans 800.

In addition, a heat dissipation fan 800 may also be disposed between the first heating vent 101 and the second heating vent 102. For example, when electronic components that each generate a relatively large amount of heat exist between the first heating vent 101 and the second heating vent 102, the heat dissipation fan 800 may be specifically determined based on positions of these electronic components that each generate a relatively large amount of heat, to enhance single-point heat dissipation, help dissipate heat for the electronic components that each generate a relatively large amount of heat, and avoid excessively high temperatures of partial regions that are of the housing 100 and that correspond to the electronic components that each generate a relatively large amount of heat.

Based on the foregoing description, when a heat dissipation groove is disposed on the inner wall of the housing 100, the heat dissipation fan 800 between the first heating vent 101 and the second heating vent 102 may be disposed in the heat dissipation groove, to effectively guide some air to circulate along the heat dissipation groove.

It may be understood that thereby may be one heat dissipation fan 800. In this case, the heat dissipation fan 800 may be disposed in the first heating vent 101 or disposed near the first heating vent 101. Alternatively, the heat dissipation fan 800 may be disposed in the second heating vent 102 or disposed near the second heating vent 102. Alternatively, the heat dissipation fan 800 may be disposed between the first heating vent 101 and the second heating vent 102. When a heat dissipation groove is disposed on the inner wall of the housing 100, the heat dissipation fan 800 may be disposed in the heat dissipation groove.

Figure 11:
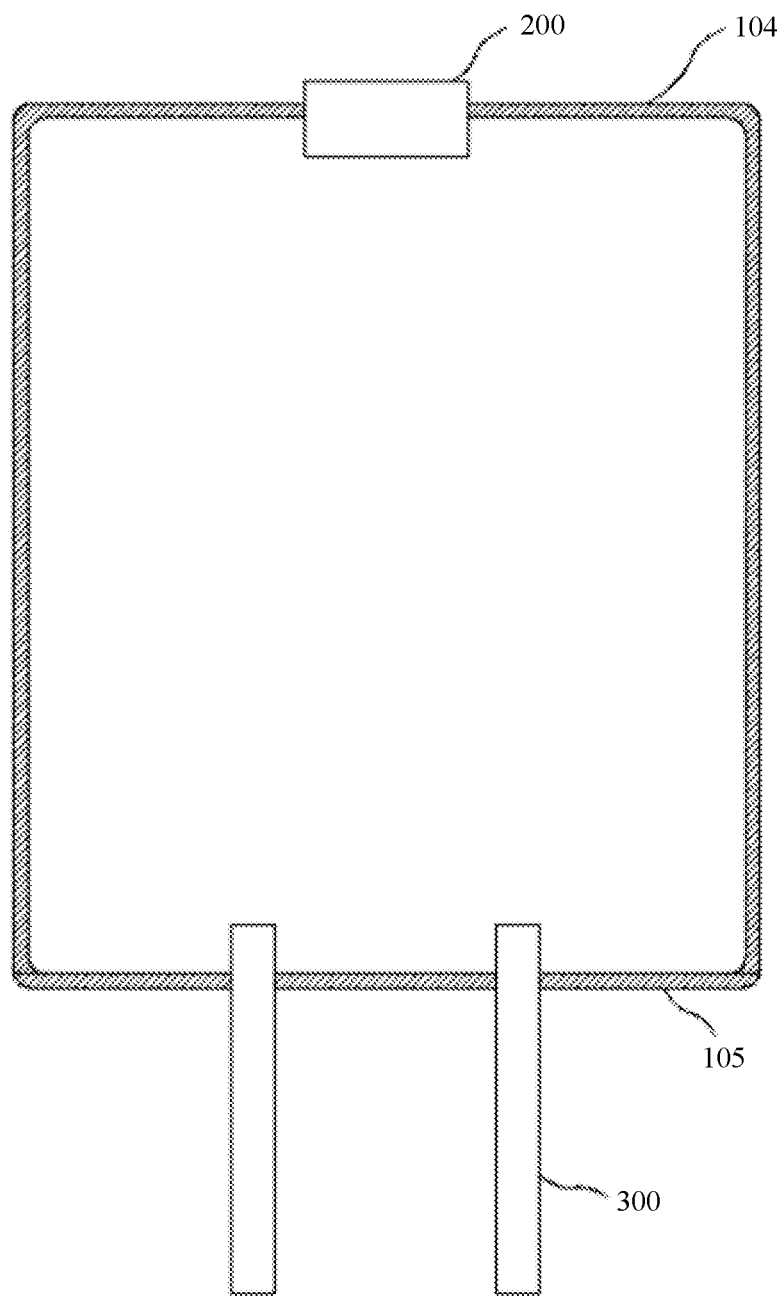
FIG. 11 is a schematic diagram of still another cross-sectional structure of the power adapter shown in FIG. 1 in an x direction.

FIG. 11 is a schematic diagram of still another cross-sectional structure of the power adapter shown in FIG. 1 in an x direction. As shown in FIG. 11, in some embodiments, the housing may include a first part 104 and a second part 105 that are sequentially connected. In this case, the line interface 200 may be disposed on the first part 104, and the power connector 300 may be disposed on the second part 105. The first part 104 may be of a hollow columnar structure in which one end is closed, the second part 105 may be of a plate-shape structure, and the second part 105 is connected to the other end of the first part 104, so that the housing forms a closed structure.

During specific machining, after the circuit board assembly coated with the first heat dissipation part 600 and the second heat dissipation part 700 is placed on the first part 104, the second part 105 may be connected to the first part 104, to package the circuit board assembly coated with the first heat dissipation part 600 and the second heat dissipation part 700 in the housing, so that overall machining of the power adapter can be more convenient.

Figure 12:
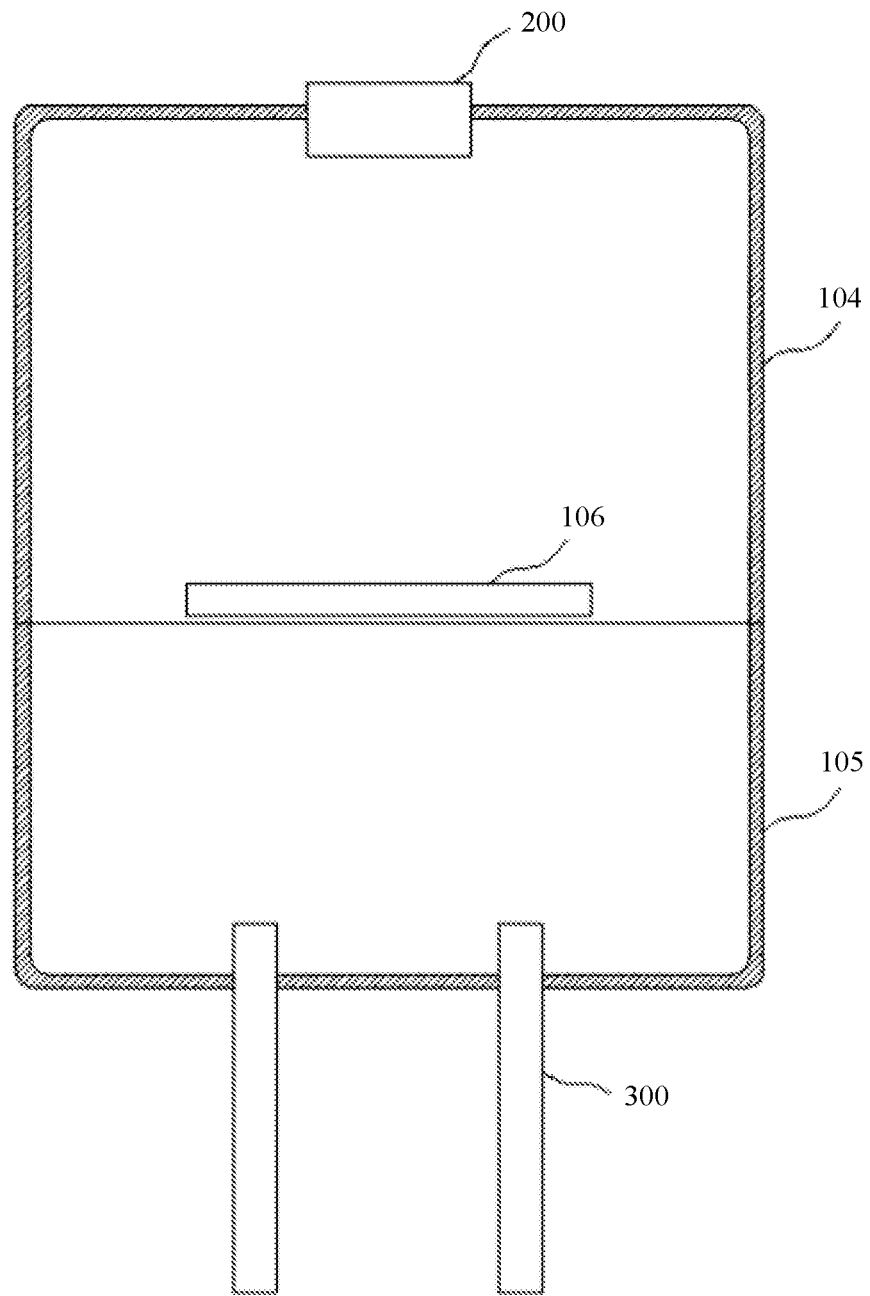
FIG. 12 is a schematic diagram of still another cross-sectional structure of the power adapter shown in FIG. 1 in an x direction.
Figure 13:
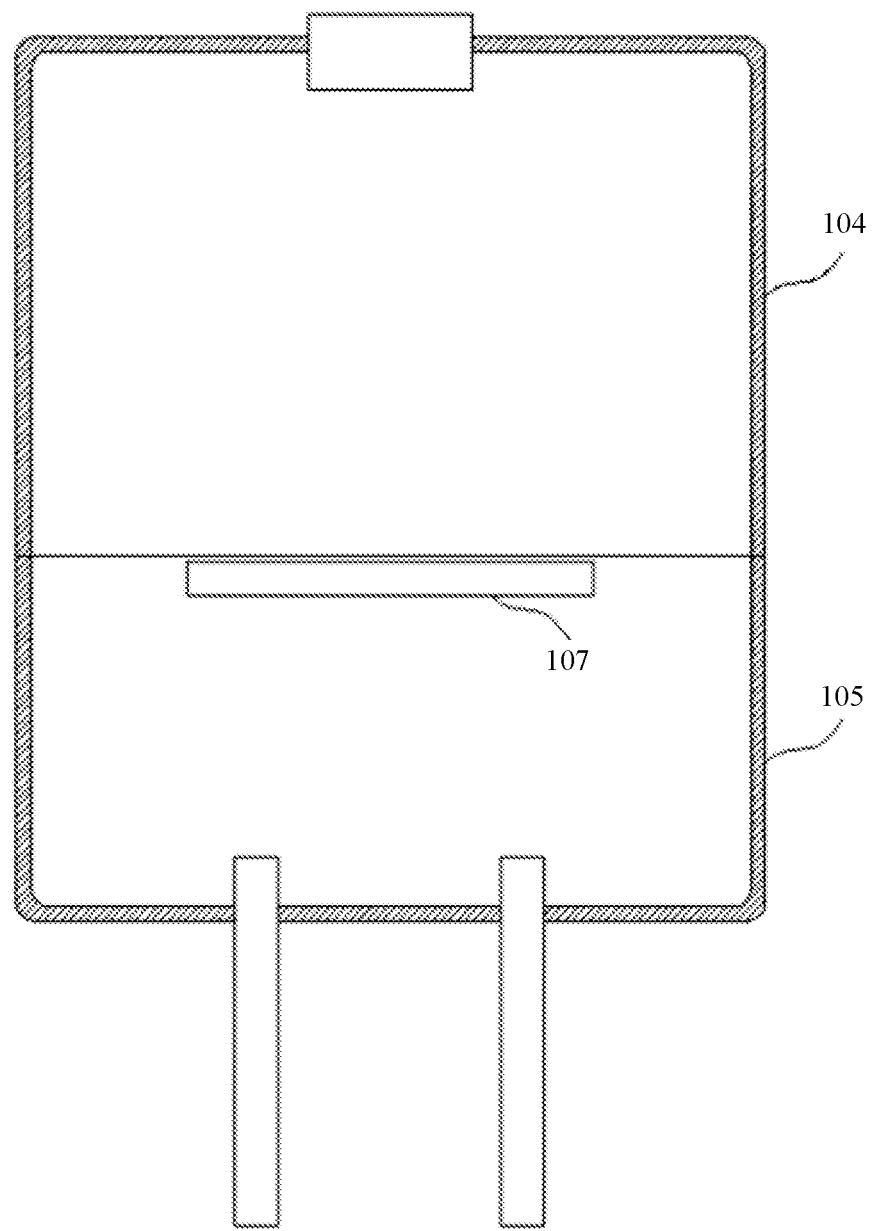
FIG. 13 is a schematic diagram of still another cross-sectional structure of the power adapter shown in FIG. 1 in an x direction.
Figure 14:
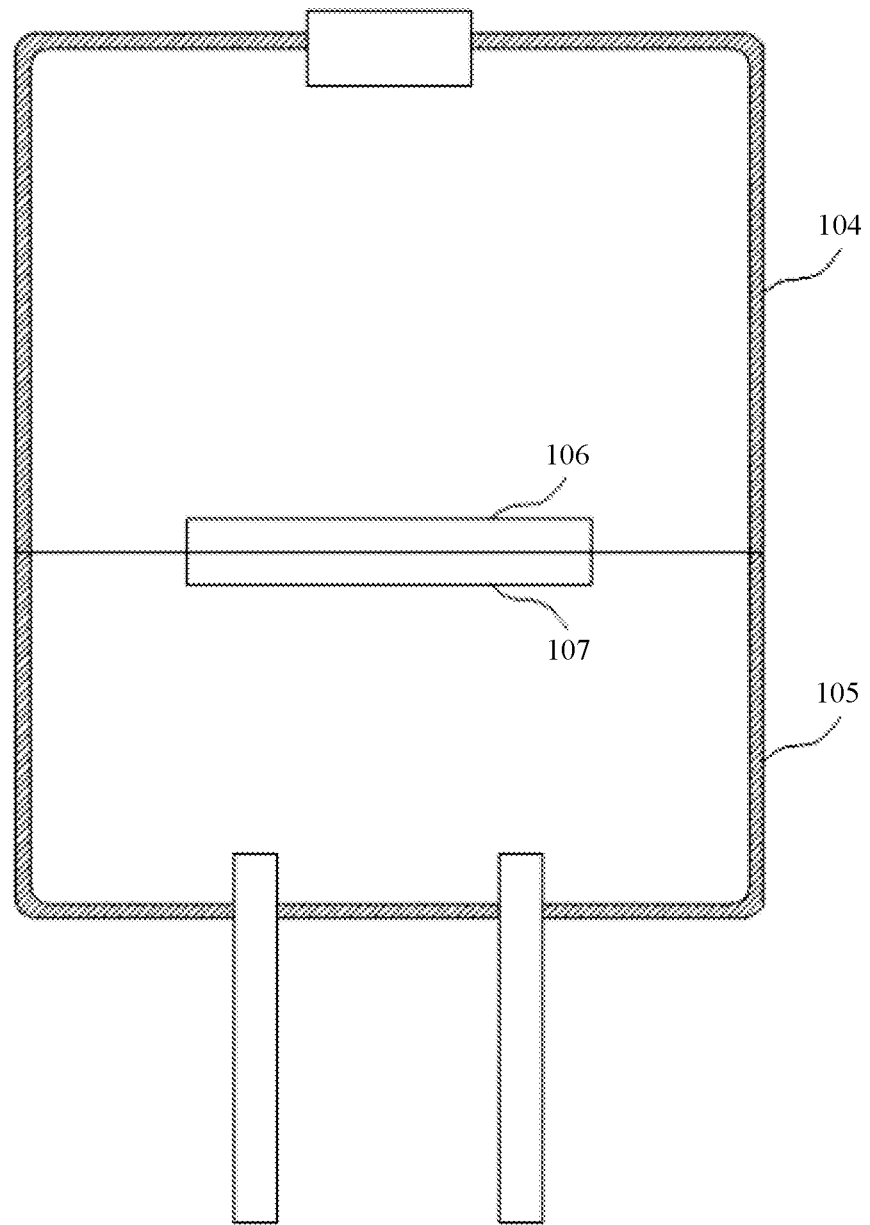
FIG. 14 is a schematic diagram of still another cross-sectional structure of the power adapter shown in FIG. 1 in an x direction.

FIG. 12, FIG. 13, and FIG. 14 each are a schematic diagram of still another cross-sectional structure of the power adapter shown in FIG. 1 in an x direction. As shown in FIG. 12, in some other embodiments, the housing may include a first part 104 and a second part 105 that are sequentially connected, the first part 104 and the second part 105 are connected to form a closed structure, the line interface 200 may be disposed on the first part 104, and the power connector 300 may be disposed on the second part 105. The first part 104 is of a hollow columnar structure in which one end is open and the other end is closed, and the second part 105 is also of a hollow columnar structure in which one end is open and the other end is closed. The open end of the first part 104 is connected to the open end of the second part 105, to form a closed housing through splicing.

Refer to FIG. 12 and FIG. 13 together. During specific implementation, a first protrusion 106 may be disposed on an inner wall of the first part 104, and the first protrusion 106 may correspond to a position of the second heat dissipation part, or the first protrusion 106 may correspond to a position of an electronic component that generates a relatively small amount of heat in the circuit board assembly, to relatively quickly transfer heat generated when the electronic component that generates a relatively small amount of heat works to the housing, and then dissipate the heat to the outside by using the housing. Similarly, a second protrusion 107 may be disposed on an inner wall of the second part 105, a function of the second protrusion 107 is the same as that of the first protrusion 106, and a position of the second protrusion 107 may be determined based on position distribution of electronic components that each generate a relatively small amount of heat in the circuit board assembly. When the electronic components that each generate a relatively small amount of heat in the circuit board assembly are relatively concentrated and are located at a joint of the first part 104 and the second part 105, only a first protrusion 106 may be disposed at an opening of the first part 104, or only a second protrusion 107 may be disposed at an opening of the second part 105. Alternatively, as shown in FIG. 14, a first protrusion 106 is disposed at an opening of the first part 104, and a second protrusion 107 is disposed at an opening of the second part 105. In addition, after the open end of the first part 104 is connected to the open end of the second part 105, the first protrusion 106 may abut against the second protrusion 107 to form a relatively large protrusion.

In some other embodiments, the housing may include a plurality of parts, such as a first part, a second part, and a third part, and other parts including the third part may be connected between the first part and the second part, to enable, through splicing, the housing to form a closed structure. The line interface may be disposed on the first part, and the power connector may be disposed on the second part. With reference to the foregoing description, similarly, a protrusion extending to the inside of the housing may be disposed at a joint of adjacent parts. In this design, housing machining is more diversified, so that more machining conditions can be adapted to and different machining requirements can be met.

It should be noted that, the foregoing first protrusion and second protrusion are disposed on the inner wall of the housing, that is, the inner wall of the housing is not a smooth surface. However, because the housing is a split structure including the first part and the second part, this does not affect installation of the circuit board assembly coated with the first heat dissipation part and the second heat dissipation part in the housing. Therefore, advantages of the power adapter in this embodiment of this application are also reflected. The first heat dissipation part and the second heat dissipation part are formed on the circuit board assembly in the out-of-housing potting manner. This breaks through a limitation of a machining condition of existing in-housing potting, so that a potting condition is wider; and also breaks through a plurality of housing machining limitations, so that housing machining can be more flexible and diversified, thereby improving production efficiency of the power adapter as a whole.

In a specific implementation, the protrusion on the inner wall of the housing may be pre-made on the inner wall of the housing, that is, the protrusion is integrally formed with the housing. Alternatively, the protrusion on the inner wall of the housing may be attached to the inner wall of the housing. In this case, the protrusion may specifically use a sheet-like structure.

For a method for forming the power adapter in this embodiment of this application, refer to the following descriptions:

Refer to FIG. 2. The first heat dissipation part 600 is formed outside the circuit board assembly through coating by using a glue potting process in a mold, and during the formation, the first heat dissipation part 600 is enabled to fasten the line interface 200 and the power connector 300 relative to the circuit board assembly, and a shape of the first heat dissipation part 600 is enabled to approximate to a shape of an inner wall profile of the housing 100 of the power adapter and a size of the first heat dissipation part 600 is enabled to be smaller than a size of the inner wall of the housing 100, to ensure that after the circuit board assembly coated with the first heat dissipation part 600 is installed in the housing 100, there is an appropriate gap between the outer wall of the first heat dissipation part 600 and the inner wall of the housing 100. A minimum width of the gap between the outer wall of the first heat dissipation part 600 and the inner wall of the housing 100 may be a. A value of a may be comprehensively determined based on the size of the inner wall of the housing 100, a size of the circuit board assembly, an actual temperature requirement of the housing 100, a thermal resistance requirement that needs to be met by the air layer between the first heat dissipation part 600 and the housing 100, and the like.

After the first heat dissipation part 600 is formed and demolded, the circuit board assembly coated with the first heat dissipation part 600 is disposed inside the housing 100 together with the line interface 200 and the power connector 300. A free end of the power connector 300 is enabled to penetrate out of the housing, and a gap is enabled to exist between the outer wall of the first heat dissipation part 600 and the inner wall of the housing 100. After the circuit board assembly coated with the first heat dissipation part 600 is fastened inside the housing 100, the housing 100 is packaged, so that the housing 100 becomes a closed structure.

Based on the foregoing description, when structures such as the heating vent, the heat dissipation fan, and the heat dissipation groove are disposed on the housing, these structures may be formed or installed in a housing machining process. When the heat dissipation fan is disposed on the outer wall of the first heat dissipation part, a power supply line connector of the heat dissipation fan may be reserved on the outer wall of the first heat dissipation part when the first heat dissipation part is formed, and the heat dissipation fan may be installed on the outer wall of the first heat dissipation part after the first heat dissipation part is formed.

Refer to FIG. 5. When the second heat dissipation part 700 is disposed on the outer wall of the first heat dissipation part 600, the second heat dissipation part 700 may be formed together when the first heat dissipation part 600 is formed outside the circuit board assembly, and a height at which the second heat dissipation part 700 protrudes from the outer wall of the first heat dissipation part 600 may be less than or equal to a. Therefore, after the circuit board assembly on which the first heat dissipation part 600 and the second heat dissipation part 700 are formed is disposed inside the housing 100, the end that is of the second heat dissipation part 700 and that is away from the first heat dissipation part 600 may be close to the inner wall of the housing 100 or abut against the inner wall of the housing 100.

An embodiment of this application further provides a power adapter heat control system, including a controller, a temperature sensor electrically connected to the controller, and the power adapter in the foregoing embodiment. The temperature sensor may be disposed in a gap between an outer wall of a first heat dissipation part and an inner wall of a housing, for example, may be fastened to the outer wall of the first heat dissipation part, or may be fastened to the inner wall of the housing. A disposition position of the temperature sensor may correspond to a position of an electronic component that generates a relatively large amount of heat in a circuit board assembly. The controller may be integrated onto a printed circuit board of the circuit board assembly. The temperature sensor may be configured to: detect a temperature of the gap between the outer wall of the first heat dissipation part and the inner wall of the housing, and feed back an electrical signal to the controller. When the temperature of the gap between the outer wall of the first heat dissipation part and the inner wall of the housing reaches a preset temperature, the controller may control a heat dissipation fan to work, and adjust a rotation direction and a rotation speed of the heat dissipation fan. The preset temperature may be specifically determined based on a related requirement of a temperature of the housing of the power adapter.

The foregoing descriptions are merely specific implementations of this application, but are not intended to limit the protection scope of this application. Any variation or replacement readily figured out by a person skilled in the art within the technical scope disclosed in this application shall fall within the protection scope of this application.

What is claimed is:
1. A power adapter, comprising:
a housing, wherein there is accommodation space inside the housing, a line interface is disposed at a first end of the housing, and a power connector is disposed at a second end of the housing;

a circuit board assembly, which is disposed in the accommodation space, and is electrically connected to the line interface and the power connector;

a first heat dissipation part, wherein the first heat dissipation part coats the outside of the circuit board assembly, and there is a gap between an outer wall of the first heat dissipation part and an inner wall of the housing;

a second heat dissipation part is disposed on the outer wall of the first heat dissipation part, and an end of the second heat dissipation part that faces away from the first heat dissipation part is close to the inner wall of the housing or abuts against the inner wall of the housing; and a disposition position of the second heat dissipation part corresponds to a position of an electronic component that generates less heat in the circuit board assembly relative to a heat emitting component of the circuit board assembly.

2. The power adapter according to claim 1, wherein a first heating vent and a second heating vent that connect the inside and the outside of the housing are disposed in the housing, the first heating vent is located at the first end of the housing, and the second heating vent is located between the first end of the housing and the second end of the housing.

3. The power adapter according to claim 2, further comprising a heat dissipation assembly, wherein the heat dissipation assembly is disposed in the gap between the outer wall of the first heat dissipation part and the inner wall of the housing, and the heat dissipation assembly is connected to the outer wall of the first heat dissipation part or the inner wall of the housing.

4. The power adapter according to claim 3, wherein the heat dissipation assembly comprises a heat dissipation fan, and a power supply line of the heat dissipation fan is electrically connected to the circuit board assembly.

5. The power adapter according to claim 4, wherein there are a plurality of heat dissipation fans, one part of the heat dissipation fans are disposed near the first heating vent, and the other part of the heat dissipation fans are disposed near the second heating vent.

6. The power adapter according to claim 2, wherein a heat dissipation groove is disposed on the inner wall of the housing, and the heat dissipation groove extends from the first heating vent to the second heating vent.

7. The power adapter according to claim 1, wherein the housing comprises at least a first part and a second part that are sequentially connected, the line interface is disposed on the first part, and the power connector is disposed on the second part.

8. The power adapter according to claim 7, wherein the first part is of a hollow columnar structure, one end of the first part is a closed end, and the other end of the first part is an open end; the second part is of a plate-shape structure; and the second part is connected to the open end of the first part.

9. The power adapter according to claim 1, wherein the first heat dissipation part is formed by using a glue potting process.

10. A power adapter manufacturing method, comprising: forming a first heat dissipation part outside a circuit board assembly by using a glue potting process, wherein the first heat dissipation part fastens a line interface and a power connector to the circuit board assembly; disposing the circuit board assembly coated with the first heat dissipation part inside a housing together with the line interface and the power connector, wherein a free end of the power connector penetrates out of the housing, and there is a gap between an outer wall of the first heat dissipation part and an inner wall of the housing;

disposing a second heat dissipation part on the outer wall of the first heat dissipation part, wherein an end of the second heat dissipation part that faces away from the first heat dissipation part is close to the inner wall of the housing or abuts against the inner wall of the housing; and wherein a disposition position of the second heat dissipation part corresponds to a position of an electronic component that generates less heat in the circuit board assembly relative to a heat emitting component of the circuit board assembly.

11. The manufacturing method according to claim 10, wherein a minimum width of the gap between the outer wall of the first heat dissipation part and the inner wall of the housing is a; and wherein the second heat dissipation part protrudes from the outer wall of the first heat dissipation part, and a height at which the second heat dissipation part protrudes from the outer wall of the first heat dissipation part is less than or equal to a.

12. The manufacturing method according to claim 11, wherein the second heat dissipation part is integrally formed with the first heat dissipation part.

* * * * *